(12) United States Patent
Lee et al.

(10) Patent No.: US 7,332,393 B2
(45) Date of Patent: Feb. 19, 2008

(54) METHOD OF FABRICATING A CYLINDRICAL CAPACITOR

(75) Inventors: Heng-Yuan Lee, Tainan County (TW); Ching-Yuan Ho, Tainan County (TW); Lurng-Shehng Lee, Hsinchu County (TW); Chieh-Shuo Liang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 5 days.

(21) Appl. No.: 11/308,680

(22) Filed: Apr. 21, 2006

(65) Prior Publication Data

US 2007/0161178 A1    Jul. 12, 2007

(30) Foreign Application Priority Data

Jan. 11, 2006   (TW) .............................. 95101042 A

(51) Int. Cl.
*H01L 21/336* (2006.01)
*H01L 21/8234* (2006.01)
*H01L 21/8242* (2006.01)
*H01L 21/20* (2006.01)

(52) U.S. Cl. ...................... 438/243; 438/398; 438/299; 438/197

(58) Field of Classification Search ................ 438/243, 438/299, 398, 396, 197

See application file for complete search history.

(56) References Cited

U.S. PATENT DOCUMENTS

| | | | | |
|---|---|---|---|---|
| 5,807,782 A | * | 9/1998 | Koh et al. | 438/396 |
| 6,245,633 B1 | * | 6/2001 | Lou | 438/398 |
| 6,326,657 B1 | * | 12/2001 | Ohkawa | 257/296 |
| 6,867,094 B2 | | 3/2005 | Park | 438/253 |
| 6,930,347 B2 | * | 8/2005 | Ikemasu et al. | 257/311 |
| 2005/0040448 A1 | | 2/2005 | Park | 257/296 |

* cited by examiner

*Primary Examiner*—Chuong Anh Luu
(74) *Attorney, Agent, or Firm*—Jianq Chyun IP Office

(57) ABSTRACT

A cylindrical capacitor comprising at least a substrate, a cylindrical bottom electrode, a structure layer, a top electrode and a capacitor dielectric layer is provided. The substrate has several plugs. The cylindrical bottom electrodes are disposed on the substrate and electrically connected to the respective plugs. The structure layer surrounds the periphery of each cylindrical bottom electrode. The structure layers that surround the two opposing cylindrical bottom electrodes have no mutual contact while the structure layers that surround two neighboring cylindrical bottom electrodes contact each other. Furthermore, the top electrodes cover the respective cylindrical bottom electrodes and the capacitor dielectric layer is disposed between each top electrode and corresponding cylindrical bottom electrode. Due to the structure layers, the mechanical strength of the whole cylindrical capacitor is improved and the density of the capacitor can be increased.

10 Claims, 9 Drawing Sheets

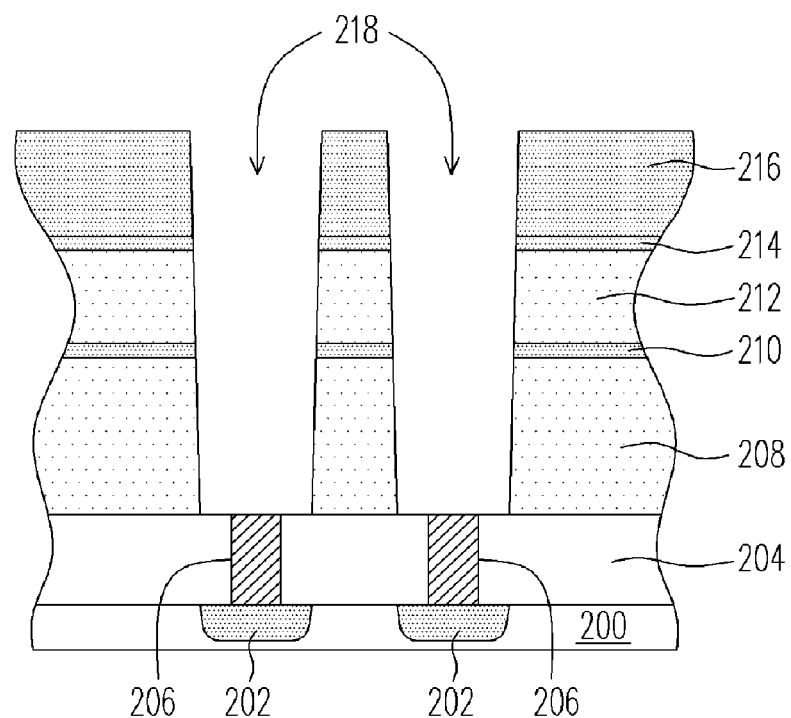
FIG. 2B-I
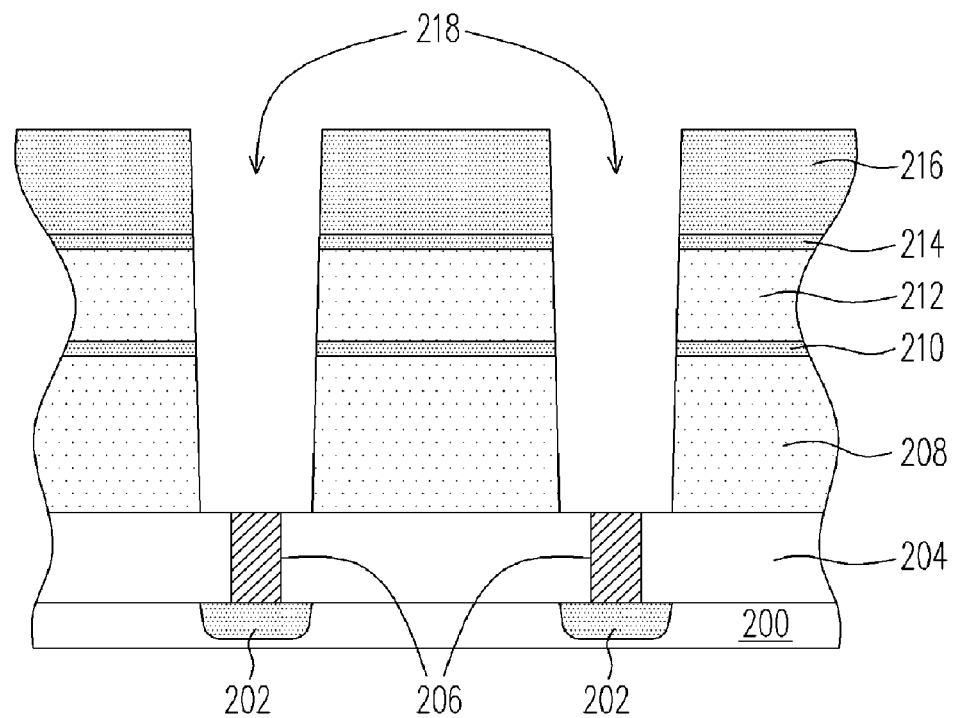
FIG. 2B-II

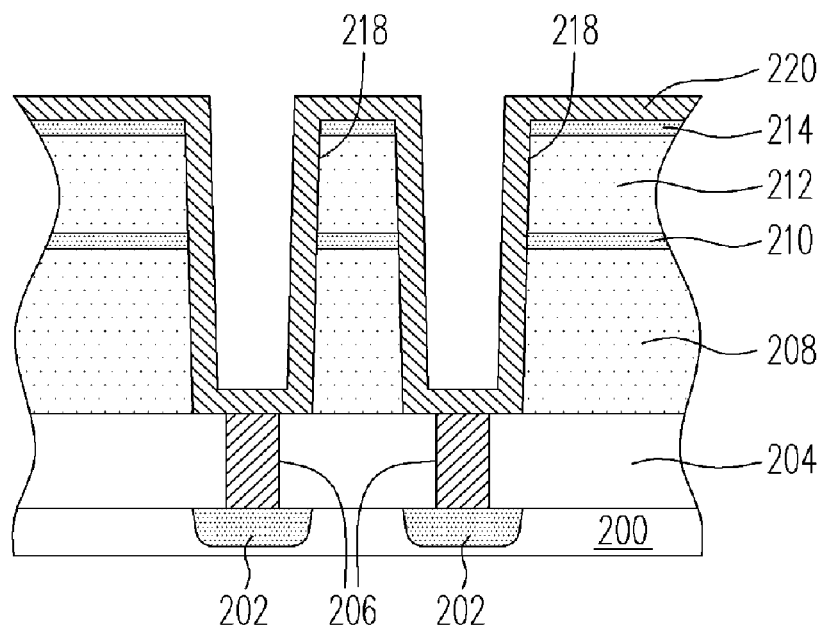
FIG. 2C-I
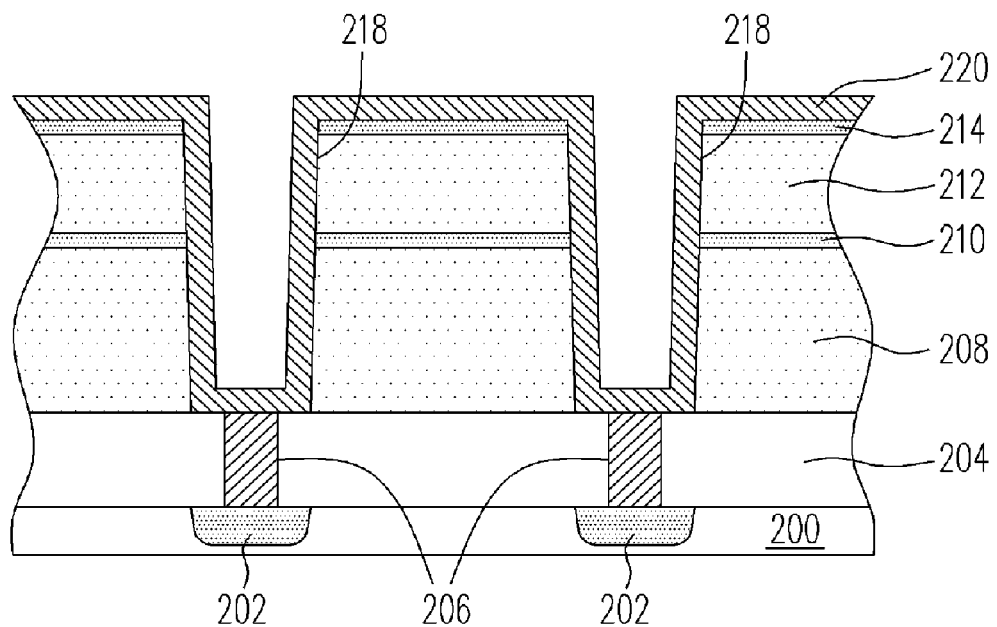
FIG. 2C-II

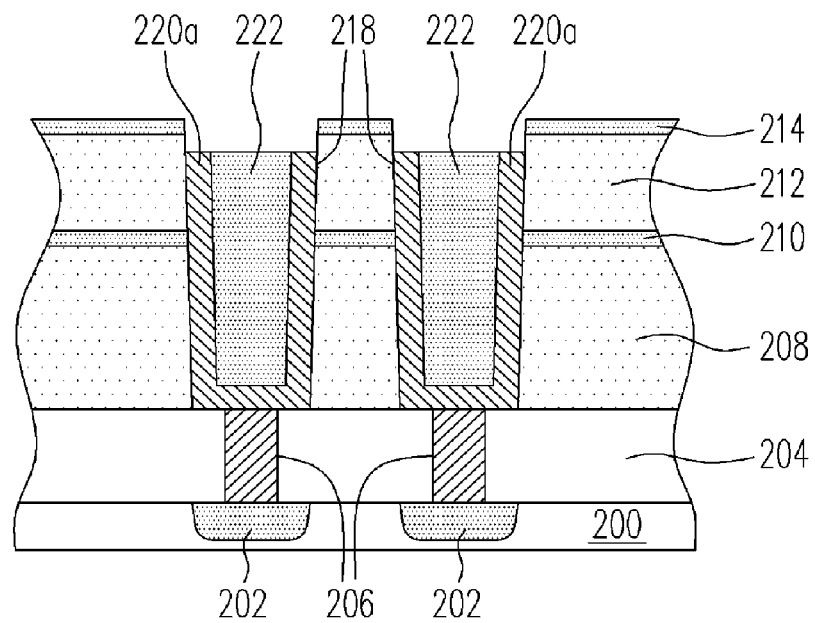
FIG. 2D-I
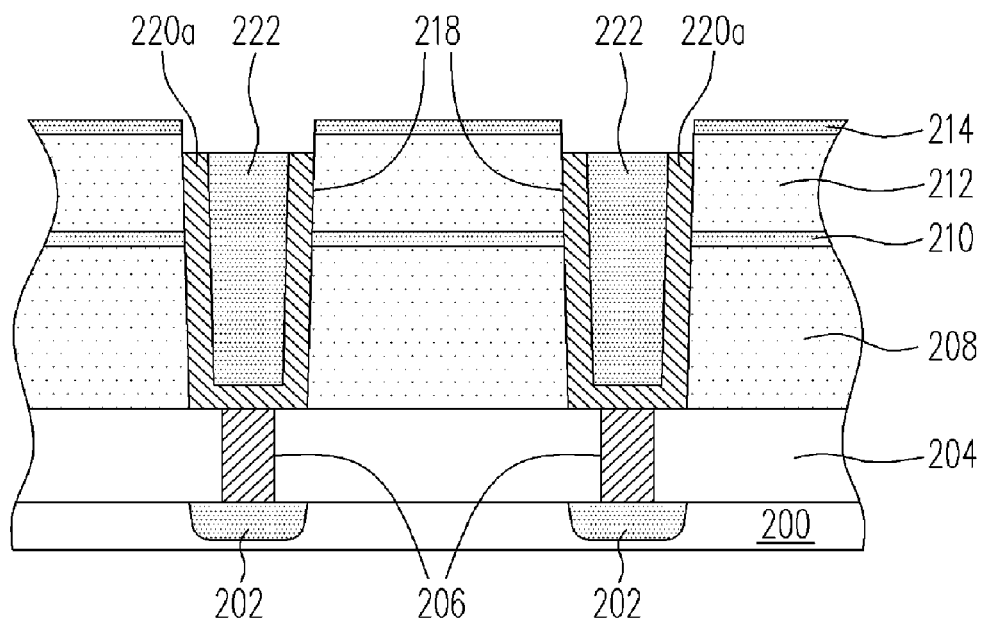
FIG. 2D-II

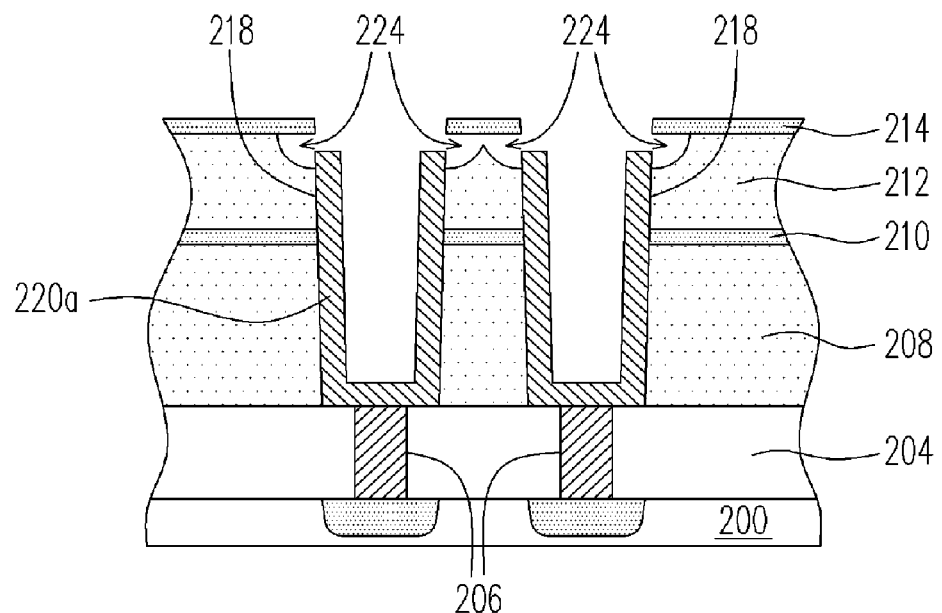
FIG. 2E-I
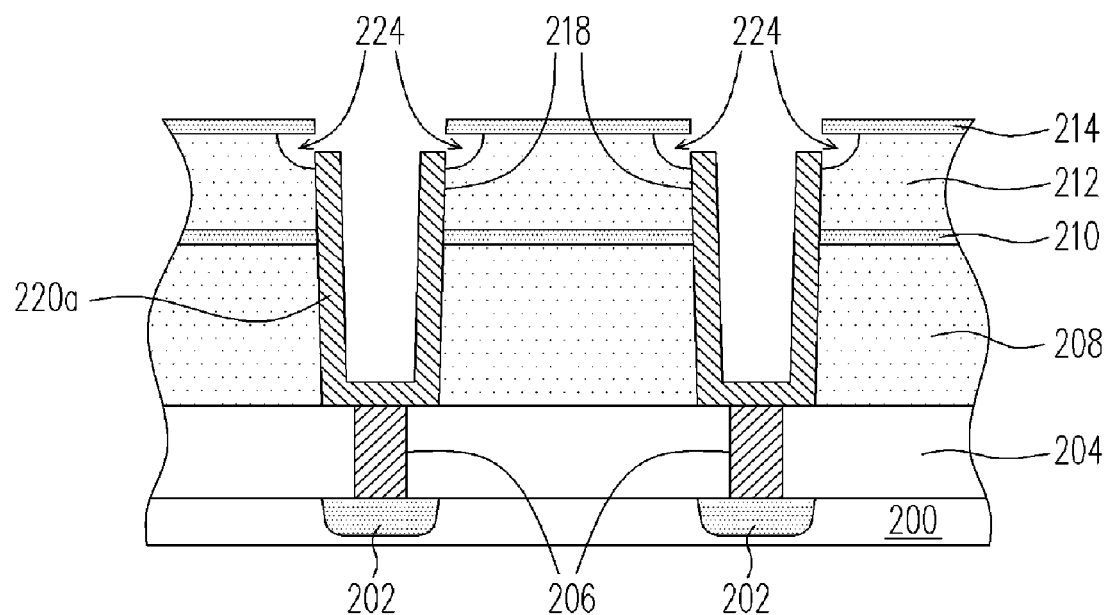
FIG. 2E-II

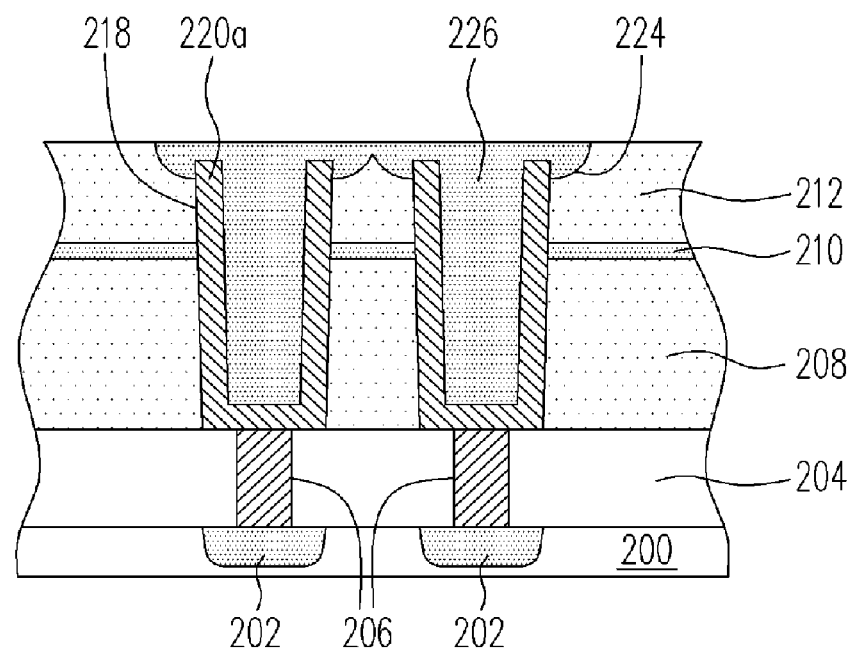
FIG. 2F-I
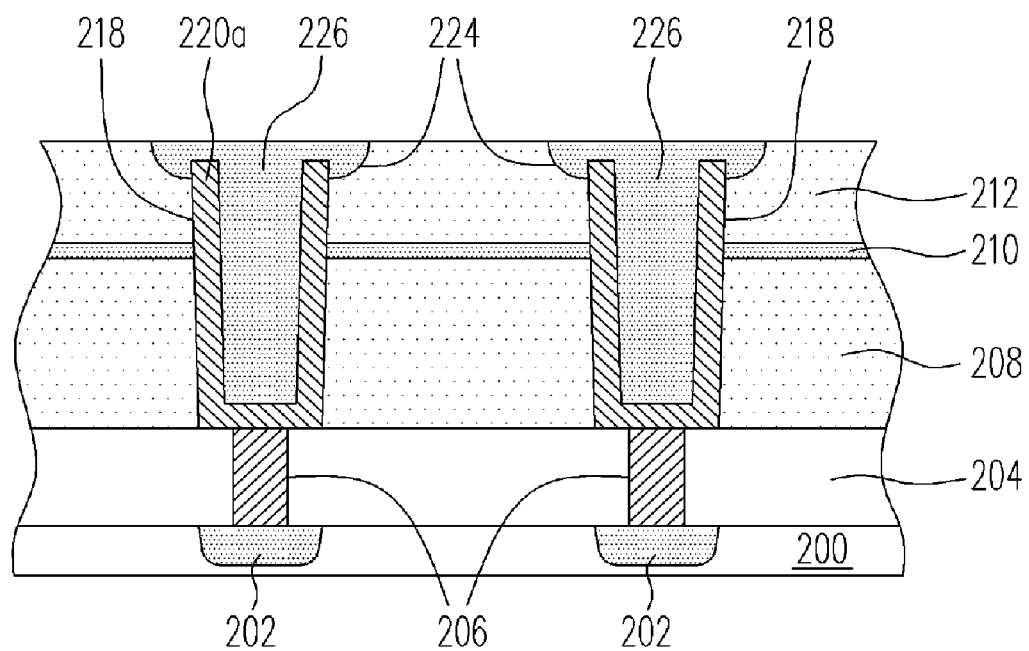
FIG. 2F-II

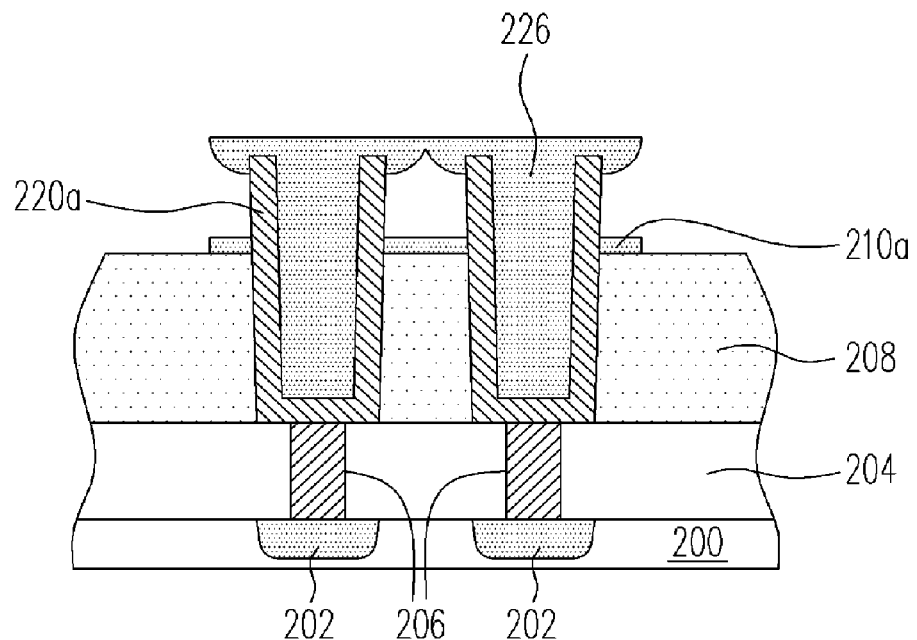
FIG. 2G-I
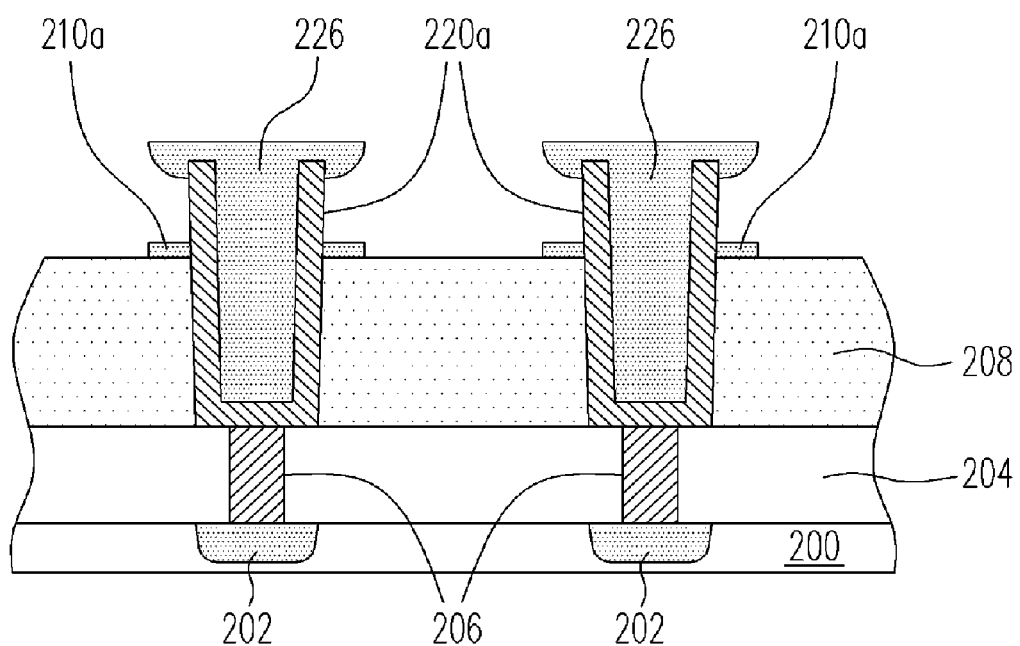
FIG. 2G-II

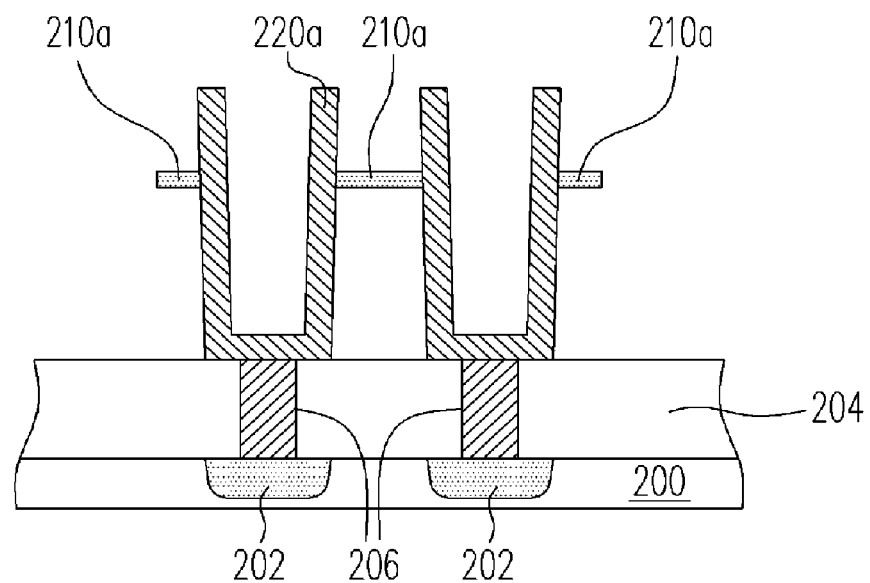
FIG. 2H-I
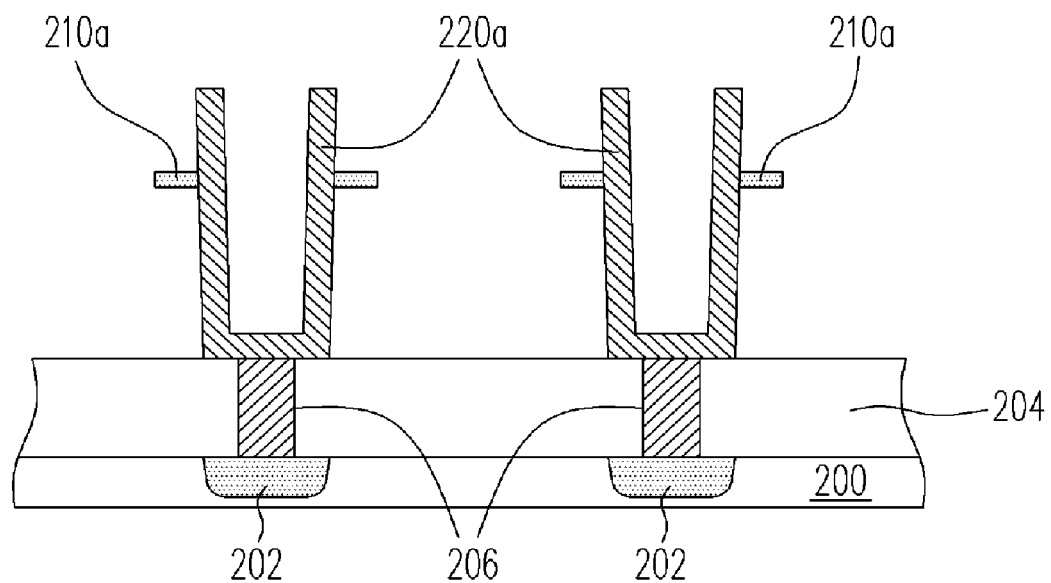
FIG. 2H-II

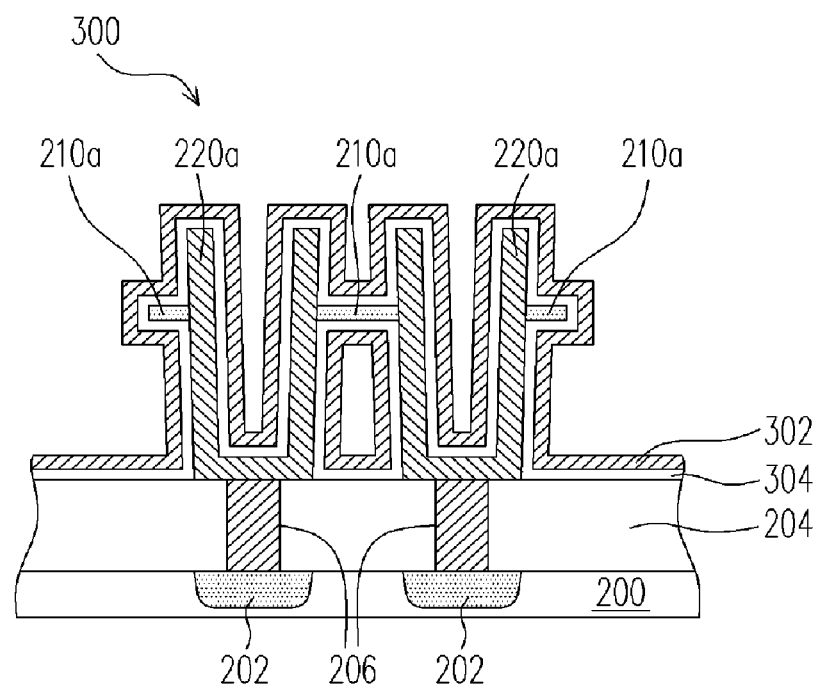
FIG. 3-I
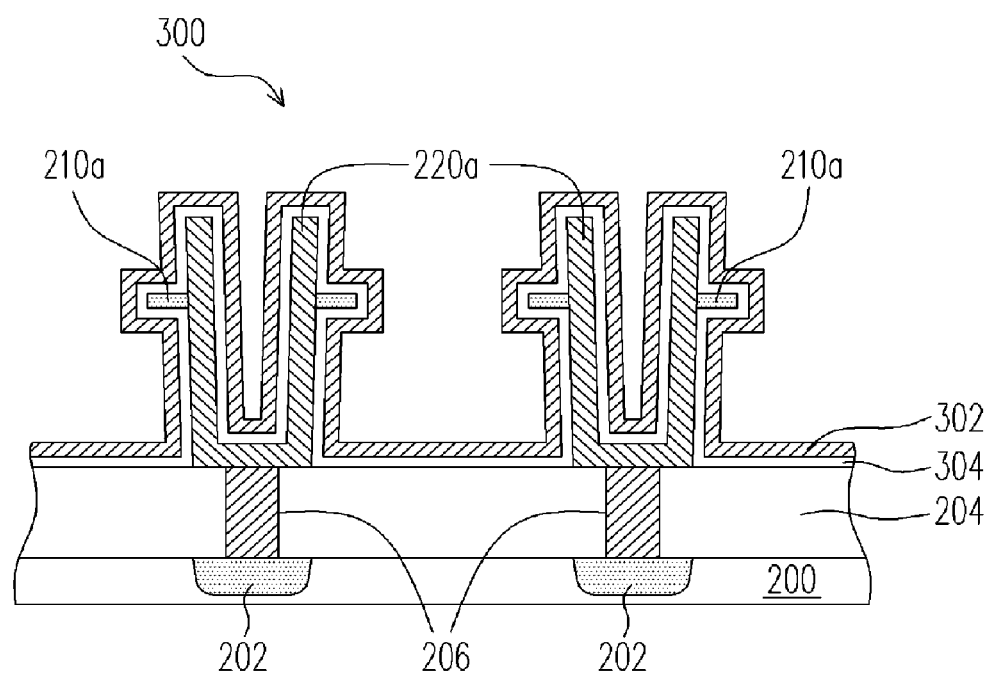
FIG. 3-II

METHOD OF FABRICATING A CYLINDRICAL CAPACITOR

CROSS-REFERENCE TO RELATED APPLICATION

This application claims the priority benefit of Taiwan application serial no. 95101042, filed on Jan. 11, 2006. All disclosure of the Taiwan application is incorporated herein by reference.

BACKGROUND OF THE INVENTION

1. Field of the Invention

The present invention relates to a cylindrical capacitor and a method of fabricating the same. More particularly, the present invention relates to a high mechanical strength cylindrical capacitor and a method of fabricating the same.

2. Description of the Related Art

A semiconductor memory mainly comprises a transistor and a capacitor. As the process of fabricating the semiconductor memory needs to fabricate patterns with a high aspect ratio, the area available for accommodating the capacitor of each device is substantially reduced. However, as the memory space needed to operate a computer software program grows rapidly, the number of required capacitors also correspondingly increases. To satisfy this growing demand for capacitors, some basic modification is required to made to the existing techniques of manufacturing semiconductor device.

At present, the minimum capacitance of each capacitor unit in a dynamic random access memory (DRAM) is greater than 25 fF. With the reduction in design dimension, a number of methods for increasing the capacitance of each capacitor unit have been suggested. The two major methods include: 1) using high dielectric constant (high k) material to produce the capacitor dielectric layer; and, 2) increasing the surface area of the capacitor by forming a cylindrical structure, forming a rod structure, forming a wing structure or forming a complicated structure by performing multiple processes. The most common means of increasing the surface area of a capacitor unit is still the cylindrical structure. However, even for the cylindrical capacitor, the height of the capacitor cylinder has to be increased as the allowed dimension is reduced. Yet, raising the height of the capacitor cylinder will destabilize the entire capacitor cylinder so that the capacitor cylinder is easily toppled. As a result, there will be a substantial drop in the production yield of the capacitor.

SUMMARY OF THE INVENTION

Accordingly, at least one objective of the present invention is to provide a method of fabricating a cylindrical capacitor with a higher mechanical strength so that the fabrication yield of the cylindrical capacitor is increased.

At least another objective of the present invention is to provide a cylindrical capacitor that can improve the mechanical strength of the cylindrical capacitor and increase the density of the capacitor.

To achieve these and other advantages and in accordance with the purpose of the invention, as embodied and broadly described herein, the present invention provides a method of fabricating a cylindrical capacitor. The method includes providing a substrate with a plug formed therein. Next, a first dielectric layer, a structure layer, a second dielectric layer and an etching stop layer are sequentially formed over the substrate. Thereafter, a hole that exposes the plug is formed in the first dielectric layer, the structure layer, the second dielectric layer and the etching stop layer. Next, a conductive layer is formed over the substrate to cover the etching stop layer and the interior surface of the hole. Next, the conductive layer disposed on the top of the hole is removed to expose a portion of the second dielectric layer. The remaining conductive layer serves as a bottom electrode. An isotropic etching of a portion of the exposed second dielectric layer is performed to form an opening at the top of the hole. Next, the etching stop layer is removed and a material layer is filled inside the opening and the hole. Next, the second dielectric layer is removed. Using the material layer as a etching mask, an anisotropic etching of the structure layer is performed to expose a portion of the first dielectric layer. The first dielectric layer is removed to expose the entire bottom electrode. Next, a capacitor dielectric layer is formed over the surface of the bottom electrode. Finally, a top electrode is formed over the surface of the capacitor dielectric layer.

According to an embodiment of the present invention, the steps for forming the hole include forming a first photoresist layer over the etching stop layer so that the area for forming the hole in the etching stop layer is exposed. Next, using the first photoresist layer as a etching mask, the etching stop layer, the second dielectric layer, the structure layer and the first dielectric layer are etched. Furthermore, after forming the hole, the first photoresist layer is removed.

According to one embodiment of the present invention, the steps for removing the conductive layer at the top of the hole include filling the hole with a second photoresist layer. Next, the second photoresist layer is etched back to expose the conductive layer at the top of the hole. Thereafter, using the second photoresist layer as a etching mask, the exposed conductive layer is exposed. Furthermore, after removing the conductive layer at the top of the hole, the second photoresist layer is also removed.

According to one embodiment of the present invention, the structure layer can be a silicon nitride layer and the etching stop layer can also be a silicon nitride layer. In addition, the material layer comprises photoresist or polysilicon.

According to one embodiment of the present invention, the step for removing the second dielectric layer includes performing a wet etching process.

According to one embodiment of the present invention, the step for forming the capacitor dielectric layer on the surface of the bottom electrode includes performing an atomic layer deposition process.

The present invention also provides a cylindrical capacitor having at least a substrate, a plurality of cylindrical bottom electrodes, a plurality of structure layers, a plurality of top electrodes and a capacitor dielectric layer. The substrate has a plurality of plugs formed therein. The cylindrical bottom electrodes are disposed on the substrate and electrically connected to the respective plugs. The structure layers surround the periphery of the cylindrical bottom electrodes. The structure layers that surround the two opposing cylindrical bottom electrodes have no mutual contact while the structure layers that surround two neighboring cylindrical bottom electrodes contact each other. Furthermore, the top electrodes cover the respective cylindrical bottom electrodes and the capacitor dielectric layer is disposed between each top electrode and corresponding cylindrical bottom electrode.

According to one embodiment of the present invention, the width of each structure layer is smaller than half the distance between two opposing cylindrical bottom electrodes.

According to one embodiment of the present invention, the width of each structure layer is greater than half the distance between two neighboring cylindrical bottom electrodes.

According to one embodiment of the present invention, the structure layer includes a silicon nitride layer.

In the present invention, a semiconductor process is used to form a structure layers that strengthens the cylindrical capacitor. Hence, the mechanical strength of the cylindrical capacitor is increased and the fabrication yield is improved. Moreover, the location of the structure layer inside the cylindrical capacitor structure of the present invention can be changed and the distance between capacitors can be reduced without making mutual contact. Therefore, density of the capacitor can be increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A, 2B-I, 2B-II, 2C-I, 2C-II, 2D-I, 2D-II, 2E-I, 2E-II, 2F-I, 2F-II, 2G-I, 2G-II, 2H-I and 2H-II are schematic cross-sectional views showing the steps for forming the cylindrical bottom electrode and the structure layer shown in FIG. 1.

FIGS. 3-I and 3-II are the schematic cross-sectional views showing the cylindrical capacitors formed after carrying out the steps in FIG. 2A through 2H-II according to one embodiment of the present invention.

DESCRIPTION OF THE PREFERRED EMBODIMENTS

Figure 1:
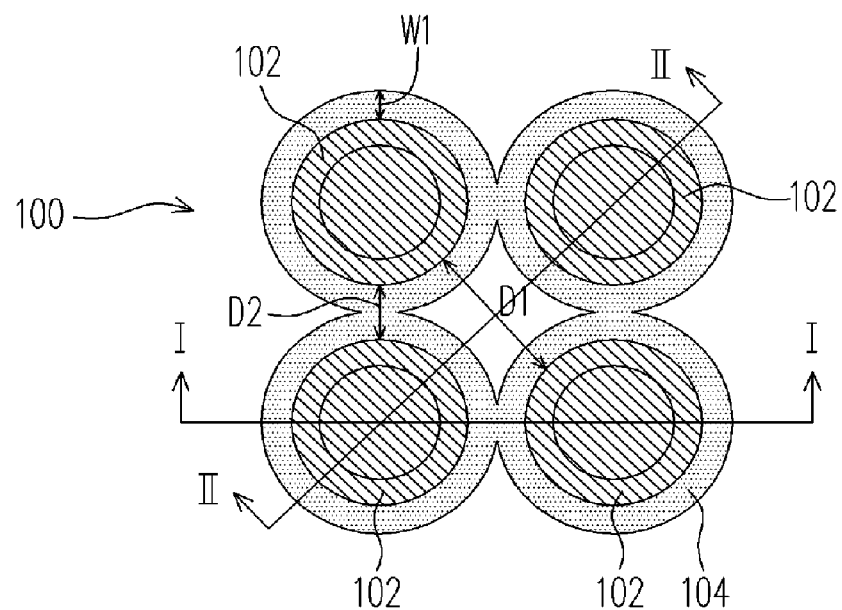
FIG. 1 is a top view showing a part of the structure of a cylindrical capacitor according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a top view showing part of the structure of a cylindrical capacitor according to one embodiment of the present invention. To illustrate the characteristic of the present invention more clearly, the top electrode and the capacitor dielectric layer of the capacitor are not shown.

As shown in FIG. 1, the cylindrical capacitor 100 in the present invention includes at least a substrate (not shown), a plurality of cylindrical bottom electrodes 102, a plurality of structure layers 104, a plurality of top electrodes (not shown) and a plurality of capacitor dielectric layers (not shown). The cylindrical bottom electrodes 102 are disposed on the substrate. The structure layers 104 surround the periphery of the cylindrical bottom electrodes 102. The structure layers 104 that surround the two opposing cylindrical bottom electrodes 102 has no mutual contact as shown by the line segment II-II that passes through two opposing cylindrical bottom electrodes 102. On the contrary, the structure layers 104 that surround the two neighboring cylindrical bottom electrodes 102 are in contact with each other as shown by the line segment I-I that passes through two neighboring cylindrical bottom electrodes 102. For example, the width W1 of the structure layer 104 is smaller than half the distance D1 between two opposing cylindrical bottom electrodes 102. In addition, the width W1 of the structure layer 104 is greater than half the distance D2 between two neighboring cylindrical bottom electrodes 102.

FIGS. 2A through 2F and FIG. 3 are schematic cross-sectional views showing the steps for fabricating a cylindrical capacitor according to one embodiment of the present invention. FIGS. 2A through 2F are schematic cross-sectional views showing the steps for forming the cylindrical bottom electrodes 102 and the structure layers 104 shown in FIG. 1. Furthermore, FIGS. 2B to 2H also show two schematic cross-sectional views along the line segment I-I and line II-II of FIG. 1 as 2B-I, 2B-II, . . . , 2H-I, 2H-II. FIGS. 3-I and 3-II are the schematic cross-sectional views showing the cylindrical capacitors formed after carrying out the steps in FIG. 2A through 2H-II according to one embodiment of the present invention. FIGS. 3-I and 3-II are schematic cross-sectional views along the line segment I-I and the line segment II-II of FIG. 1.

Figure 2A:
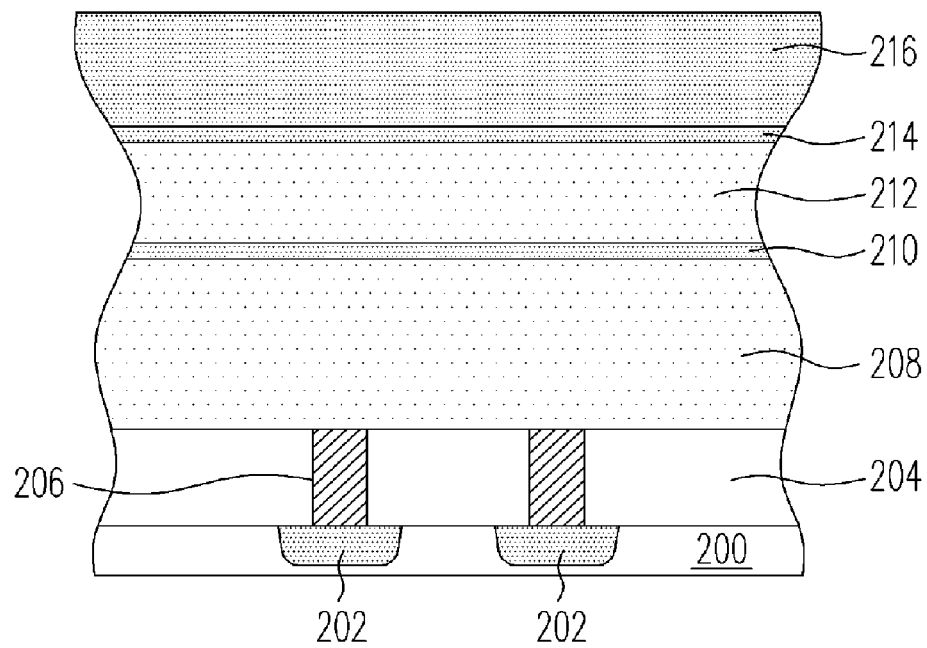

As shown in FIGS. 2A, a substrate having plugs 206 formed therein is provided. The substrate may be a silicon chip 200 comprising an inter-layer dielectric layer 204 formed thereon such that the plugs 206 are formed in the dielectric layer 204, for example. In general, the silicon chip 200 also has doped regions 202 in contact with the respective plugs 206. Next, a first dielectric layer 208, a structure layer 210, a second dielectric layer 212 and an etching stop layer 214 are sequentially formed over the substrate. The position of the structure layer 210 can be adjusted according to the actual demand instead of constrained by the location as shown in the present embodiment. Furthermore, the aforementioned structure layer 210 comprises a silicon nitride layer, for example. The etching stop layer 214 may also comprise a silicon nitride layer. Thereafter, in preparation for the subsequent fabrication of the hole for forming the bottom electrode, a first photoresist layer 216 is formed over the etching stop layer 214.

As shown in FIGS. 2B-I and 2B-II, the first photoresist layer 216 is patterned to expose the area in the etching stop layer 214 for forming a hole 218. Next, using the first photoresist layer 216 as an etching mask, the etching stop layer 214, the second dielectric layer 212, the structure layer 210 and the first dielectric layer 208 are etched to form the hole 218 that exposes the plug 206 where the bottom electrode (102 as shown in 1) is subsequently formed.

As shown in FIGS. 2C-I and 2C-II, the first photoresist layer (216 as shown in FIG. 2B) and a conductive layer 220 are formed over the substrate to cover the etching stop layer 214 and the inner surface of the hole 218.

As shown in FIGS. 2D-I and 2D-II, a portion of the conductive layer (220 as shown in FIG. 2C) at the top of the hole 218 is removed to expose a portion of the second dielectric layer 212. The remaining portion of the conductive layer serves as a bottom electrode 220a. The method of removing the portion of the conductive layer at the top of the hole 218 includes filling the hole 218 with a second photoresist layer 222 and then etching back the second photoresist layer 222 to expose the portion of the conductive layer at the top of the hole 218. Finally, the exposed portion of the conductive layer is etched using the second photoresist layer 222 as an etching mask.

As shown in FIGS. 2E-I and 2E-II, the second photoresist layer (222 as shown in FIG. 2D) is removed. Thereafter, an isotropic etching process is performed for removing a portion of the exposed second dielectric layer 212 to form an opening 224 at the top of the hole 218.

As shown in FIGS. 2F-I and 2F-II, the etching stop layer (214 as shown in FIG. 2E) is removed. Next, a material is formed over the substrate and fill the opening 224 and the hole 218 to form a material layer 226. The material layer 226 includes photoresist, polysilicon or any other material having a high etching selectivity with respect to the second dielectric layer 212 and the etching stop layer 214, for example.

As shown in FIGS. 2G-I and 2G-II, the second dielectric layer (212 as shown in FIG. 2F) is removed by performing a wet etching process, for example. Next, using the material layer 226 as a mask, an anisotropic etching of the structure layer (210 as shown in FIG. 2F) is performed to expose a portion of the first dielectric layer 208. The structure layer 210a so obtained is the structure layer 104 in FIG. 1.

As shown in FIGS. 2H-I and 2H-II, the first dielectric layer (208 as shown in FIG. 2G) is removed to expose the bottom electrode 220a completely. The bottom electrode 220a is a cylindrical bottom electrode with a substantially increased mechanical strength due to the support provided by the structure layer 210a.

Thereafter, as shown in FIGS. 3-I and 3-II, a capacitor dielectric layer 304 is formed on the surface of the bottom electrode 220a. The capacitor dielectric layer 304 is formed, for example, by performing an atomic layer deposition (ALD) process. Then, a top electrode 302 is formed on the capacitor dielectric layer 304.

As shown in FIGS. 1, 3-I and 3-II, due to the location of the structure layer 104 and width, the cylindrical capacitor 100 of the present invention not only has mechanical support but also has a higher density of the capacitor.

In summary, the major advantages of the present invention includes providing an improved semiconductor process for forming the cylindrical capacitor and a structure layer for supporting the capacitor so that the mechanical strength of the cylindrical capacitor is increased and the product yield is improved. Furthermore, the location of the structure layer included in the cylindrical capacitor structure of the present invention can be changed and the distance between neighboring capacitors can be reduced without contacting each other so that the density of the capacitor is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a cylindrical capacitor, comprising the steps of:
   providing a substrate having a plug formed therein;
   sequentially forming a first dielectric layer, a structure layer, a second dielectric layer and an etching stop layer over the substrate;
   forming a hole passing through the first dielectric layer, the structure layer, the second dielectric layer and the etching stop layer such that the hole exposes the plug;
   forming a conductive layer over the substrate to cover the etching stop layer and an inner surface of the hole;
   removing a portion of the conductive layer at the top of the hole to expose a portion of the second dielectric layer such that a remaining portion of the conductive layer serves as a bottom electrode;
   performing an isotropic etching process to remove a portion of the exposed second dielectric layer to form an opening at the top of the hole;
   removing the etching stop layer;
   filling the opening and the hole with a material layer;
   removing the second dielectric layer;
   performing an anisotropic etching process on the structure layer using the material layer as a etching mask to expose a portion of the first dielectric layer;
   removing the first dielectric layer so that the bottom electrode is completely exposed;
   forming a capacitor dielectric layer on the surface of the bottom electrode; and
   forming a top electrode on the surface of the capacitor dielectric layer.

2. The method of claim 1, wherein the step for forming the hole comprises:
   forming a first photoresist layer over the etching stop layer to expose an area for forming the hole in the etching stop layer; and
   etching the etching stop layer, the second dielectric layer, the structure layer and the first dielectric layer using the first photoresist layer as a etching mask.

3. The method of claim 2, further comprising a step of removing the first photoresist layer after the step of forming the hole.

4. The method of claim 1, wherein the step for removing the conductive layer at the top of the hole comprises:
   filling the hole with a photoresist material to form a second photoresist layer;
   etching back the second photoresist layer to expose the conductive layer at the top of the hole; and
   etching the exposed conductive layer using the second photoresist layer as a etching mask.

5. The method of claim 4, further comprising a step of removing the second photoresist layer after the step of removing the conductive layer at the top of the hole.

6. The method of claim 1, wherein the structure layer includes a silicon nitride layer.

7. The method of claim 1, wherein the etching stop layer includes a silicon nitride layer.

8. The method of claim 1, wherein the material layer is fabricated using photoresist or polysilicon.

9. The method of claim 1, wherein the step of removing the second dielectric layer includes performing a wet etching process.

10. The method of claim 1, wherein the step of forming the capacitor dielectric layer on the surface of the bottom electrode comprises performing an atomic layer deposition (ALD) process.

* * * * *